(12) United States Patent
Kim et al.

(10) Patent No.: US 9,941,168 B1
(45) Date of Patent: Apr. 10, 2018

(54) METHOD FOR MANUFACTURING SEMICONDUCTOR DEVICE BY EPITAXIAL LIFT-OFF USING PLANE DEPENDENCY OF III-V COMPOUND

(71) Applicant: KOREA INSTITUTE OF SCIENCE AND TECHNOLOGY, Seoul (KR)

(72) Inventors: Sanghyeon Kim, Seoul (KR); Hyung-jun Kim, Seoul (KR); Jae-Phil Shim, Seoul (KR); Seong Kwang Kim, Seoul (KR); Won Jun Choi, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 15/631,309

(22) Filed: Jun. 23, 2017

(30) Foreign Application Priority Data

Sep. 21, 2016 (KR) .................. 10-2016-0120538
Sep. 28, 2016 (KR) .................. 10-2016-0124630
Sep. 28, 2016 (KR) .................. 10-2016-0124631

(51) Int. Cl.
*H01L 21/78* (2006.01)
*H01L 21/306* (2006.01)
*H01L 21/02* (2006.01)

(52) U.S. Cl.
CPC .... *H01L 21/7813* (2013.01); *H01L 21/02381* (2013.01); *H01L 21/02389* (2013.01);
(Continued)

(58) Field of Classification Search
None
See application file for complete search history.

(56) References Cited

U.S. PATENT DOCUMENTS 5,201,996 A 4/1993 Gmitter et al.
5,641,381 A * 6/1997 Bailey .............. C30B 25/18
117/915
(Continued)

FOREIGN PATENT DOCUMENTS

JP  2005117068 A  4/2005
KR  101455724 B1  10/2014
(Continued)

OTHER PUBLICATIONS

Hyeongtag Jeon, "Etching", Hanyang University Semiconductor Materials Lab, 2010 <URL: http://hjeon.namoweb.net/lecture/chapter-5>.
(Continued)

*Primary Examiner* — Joseph Schoenholtz
(74) *Attorney, Agent, or Firm* — Cantor Colburn LLP

(57) ABSTRACT

A method for manufacturing a semiconductor device by epitaxial lift-off includes: forming a sacrificial layer containing an III-V compound on a first substrate, forming a device layer on the sacrificial layer, patterning the sacrificial layer and the device layer into a shape having an extending portion along a first direction determined based on a surface orientation of the III-V compound of the sacrificial layer, bonding the patterned device layer onto a second substrate, and etching the sacrificial layer by using an etching solution in a state where the device layer is bonded onto the second substrate, to remove the sacrificial layer and the first substrate. Using the method for manufacturing a semiconductor device, it is possible to improve a process yield and increase a process speed by using the difference in etch rates depending on crystal orientation, which is an inherent characteristic of an III-V compound, during an ELO process.

17 Claims, 16 Drawing Sheets

(52) U.S. Cl.
CPC .. *H01L 21/02392* (2013.01); *H01L 21/02395* (2013.01); *H01L 21/02461* (2013.01); *H01L 21/02463* (2013.01); *H01L 21/02502* (2013.01); *H01L 21/02516* (2013.01); *H01L 21/30617* (2013.01)

(56) References Cited

U.S. PATENT DOCUMENTS

| | | | |
|---|---|---|---|
| 5,723,360 | A | 3/1998 | Iwasaki |
| 8,623,669 | B2 | 1/2014 | Horng et al. |
| 8,778,199 | B2 | 7/2014 | Cornfeld et al. |
| 2008/0049802 | A1 | 2/2008 | Kim et al. |
| 2011/0186910 | A1 | 8/2011 | Forrest et al. |
| 2013/0042801 | A1* | 2/2013 | Gmitter .............. C30B 33/06 117/58 |
| 2017/0062232 | A1* | 3/2017 | Cheng ............... H01L 21/0262 |

FOREIGN PATENT DOCUMENTS

| | | |
|---|---|---|
| KR | 1020140128393 A | 11/2014 |
| KR | 1020150012538 A | 2/2015 |
| KR | 1020160108440 A | 9/2016 |
| WO | 2009155122 A2 | 12/2009 |
| WO | 2010099544 A2 | 9/2010 |
| WO | 2013119728 A2 | 8/2013 |
| WO | 2015012513 A1 | 1/2015 |
| WO | 2015156874 A2 | 10/2015 |

OTHER PUBLICATIONS

Adachi et al., "Chemical Etching Characteristics of GaAs(100) Surfaces in Aqueous HF Solutions", Journal of The Electrochemical Society, 147(12), 2000, 4618-4624.

Gu et al., "First Experimental Demonstration of Gate-all-around III-V MOSFETs by Top-down Approach", IEDM 2011, 1-769-1-772.

Huub Ambrosius, "JePPIX Course Processing Wet and dry etching processes", Technische Universiteit Eindhoven, 2014 p. 1-57.

Niftrik et al., "HF Species and Dissolved Oxygen on the Epitaxial Lift-Off Process of GaAs Using AlAsP Release Layers", Journal of the Electrochemical Society, 155(1), 2008, D35-D39.

Sun et al., "Optimized cleaning method for producing device quality InP(100) surfaces", Journal of Applied Physics, 97, 2005, 124902.

Xue et al., "Excellent Device Performance of 3D In0.53Ga0.47As Gate-Wrap-Around Field-Effect-Transistors with High-k Gate Dielectrics", IEDM, 2012, 12-629-12-632.

* cited by examiner

METHOD FOR MANUFACTURING SEMICONDUCTOR DEVICE BY EPITAXIAL LIFT-OFF USING PLANE DEPENDENCY OF III-V COMPOUND

CROSS-REFERENCE TO RELATED APPLICATION

This application claims priority to Korean Patent Application No. 10-2016-0120538 filed on Sep. 21, 2016, Korean Patent Application No. 10-2016-0124630 filed on Sep. 28, 2016, and Korean Patent Application No. 10-2016-0124631 filed on Sep. 28, 2016, and all the benefits accruing therefrom under 35 U.S.C. § 119, the contents of which in its entirety are herein incorporated by reference.

BACKGROUND

1. Field

Embodiments relate to a method for manufacturing a semiconductor device by epitaxial lift-off (ELO) using plane dependency of an III-V compound.

[Description about National Research and Development Support]

This study was supported by following national research projects.

Project of Ministry of Science, ICT & Future planning, Republic of Korea, for development of original technology in electronic information device industries (Korea Institute of Science and Technology, Project No. 1711041155) under the superintendence of Korea Evaluation Institute of Industrial Technology; and Project of Ministry of Science, ICT & Future planning, Republic of Korea, for supporting individual researchers (Korea Institute of Science and Technology, Project No. 1711037587) under the superintendence of National Research Foundation of Korea.

2. Description of the Related Art

Silicon (Si) is applied to various semiconductor devices, among which solar cells, transistors or the like are representative. However, in case of solar cells, the improvement of their efficiency was not reported since the mid-2000s. Also, in case of transistors, an about 20 nanometer (nm) node process is being performed at the present, but various problems occur due to short channel effects. Thus, there is a need for a next-generation technology capable of replacing silicon-based devices.

As one alternative for the silicon-based devices, it is being actively studied to use III-V compounds, which ensure high mobility, have a direct bandgap structure and allow easy bandgap engineering. III-V compounds such as gallium arsenide (GaAs), indium phosphide (InP), gallium nitride (GaN) or the like have various advantages, but there are limits to be overcome since silicon-based platforms are mostly used in the current industries and also there is an issue of costs.

In order to solve the above problems, a method for growing an III-V buffer layer on a silicon substrate is being studied. However, if the III-V buffer layer growing method is used, defects may be generated between the silicon substrate and the III-V compound layer due to lattice mismatch, difference in thermal expansion coefficient, difference in polarity or the like, which may deteriorate the quality of a final product.

As an alternative, in order to solve the problem that it is difficult and expensive to grow an III-V compound on a silicon substrate, an III-V compound is grown on an III-V substrate into an epitaxial layer, then the III-V compound is bonded onto a silicon substrate, and then the III-V substrate is removed by means of epitaxial lift-off (ELO). However, the conventional ELO method takes a long time since it needs a substrate bonding technique using a thin sacrificial layer. Also, after bonding, the surface of the substrate may be damaged by means of an etching solution due to a long process time.

SUMMARY

An aspect of the present disclosure is directed to providing a method for manufacturing a semiconductor device, which has an increased process speed by using the difference in etch rates depending on crystal orientation, which is an inherent characteristic of an III-V compound, during a wafer bonding process and an epitaxial lift-off (ELO) process for integrating an III-V compound and a silicon (Si) substrate.

According to an embodiment, a method for manufacturing a semiconductor device by epitaxial lift-off includes: forming a sacrificial layer containing an III-V compound on a first substrate; forming a device layer on the sacrificial layer; patterning the sacrificial layer and the device layer into a shape having an extending portion along a first direction determined based on a surface orientation of the III-V compound of the sacrificial layer; bonding the patterned device layer onto a second substrate; and etching the sacrificial layer by using an etching solution in a state where the device layer is bonded onto the second substrate, to remove the sacrificial layer and the first substrate.

The III-V compound may have different etch rates depending on surface orientations. At this time, in an embodiment, the first direction may be orthogonal to a lattice direction in which the III-V compound of the sacrificial layer has a fastest etch rate.

In an embodiment, the etching of the sacrificial layer may include etching a side of the sacrificial layer from a second direction which is orthogonal to the first direction.

In an embodiment, the III-V compound of the sacrificial layer may have a (100) facet, and the first direction may be a <001> lattice direction. In another embodiment, the III-V compound of the sacrificial layer may have a (110) facet, and the first direction may be a <-100> lattice direction.

In an embodiment, the etching solution may include hydrogen fluoride (HF) and deionized water. For example, in the etching solution, a volume ratio of hydrogen fluoride (HF) and deionized water may be 1:3.

The method for manufacturing a semiconductor device by ELO according to an embodiment may further include forming an etch-stop layer on the first substrate, before forming the sacrificial layer.

In an embodiment, the first substrate may include an III-V compound, and the sacrificial layer may be formed on the first substrate by epitaxy growth.

In an embodiment, the second substrate may include silicon (Si).

According to an embodiment, the method for manufacturing a semiconductor device by ELO may further include forming a hydrophilic layer located in at least one of upper and lower portions of the sacrificial layer.

In an embodiment, the hydrophilic layer may include indium gallium phosphide (InGaP) or indium phosphide (InP).

In an embodiment, the etching solution may include hydrogen fluoride (HF) and acetone ($CH_3COCH_3$).

In an embodiment, the etching of the sacrificial layer may include applying a voltage to the sacrificial layer to have positive polarity.

In an embodiment, the applying of a voltage to the sacrificial layer to have positive polarity may include: making an anode of a voltage source into contact with the sacrificial layer; and exposing a cathode of the voltage source to the etching solution.

In an embodiment, the sacrificial layer may include aluminum arsenide (AlAs), and the etching solution may include hydrogen fluoride (HF).

In an embodiment, the etching of the sacrificial layer may include: applying a voltage to generate $[HF_2-]$ or $[H_2F_3-]$ ions in the etching solution; and reacting the $[HF_2-]$ or $[H_2F_3-]$ ions with the sacrificial layer to etch the sacrificial layer.

Using the method for manufacturing a semiconductor device by epitaxial lift-off (ELO) according to an aspect of the present disclosure, it is possible to improve a process yield and increase a process speed in comparison to the conventional ELO process by using the difference in etch rates depending on crystal orientation, which is an inherent characteristic of an III-V compound, during a wafer bonding process and an ELO process for integrating an III-V compound and a silicon (Si) substrate.

Using the method for manufacturing a semiconductor device by ELO according to an aspect of the present disclosure, during a patterning process before a wafer is bonded to a silicon (Si) substrate, a surface having a great etch rate is selected regardless of a direction of the wafer on which an III-V compound is grown, thereby improving the process speed. In addition, the sacrificial layer may be etched faster by selectively applying a voltage to the sacrificial layer and the etching solution during the ELO process and/or forming a hydrophilic layer such as an indium gallium phosphide (InGaP) layer or an indium phosphide (InP) layer on at least one of upper and lower portions of the sacrificial layer.

In addition, the method for manufacturing a semiconductor device by ELO according to an aspect of the present disclosure may be utilized to form various platforms having an III-V compound on silicon (Si) in the non-memory semiconductor field which is on a growth trend. Also, since the wafer may be reused, it is possible to reduce cost which is an entry barrier to the use of III-V compounds, and also it is possible to solve the limit in the wafer area which is an obstacle in commercial use of the conventional ELO technique.

Moreover, the method for manufacturing a semiconductor device by ELO according to an aspect of the present disclosure may be broadly utilized for heterogeneous bonding of a substrate made of a different material from the III-V compound, without being limited to bonding to silicon (Si), and may also be applied for fabricating multiple-bond devices (for example, solar cells or the like) of materials with great lattice mismatching.

DETAILED DESCRIPTION

Hereinafter, embodiments of the present disclosure will be described in detail with reference to the accompanying drawings.

Figure 1:
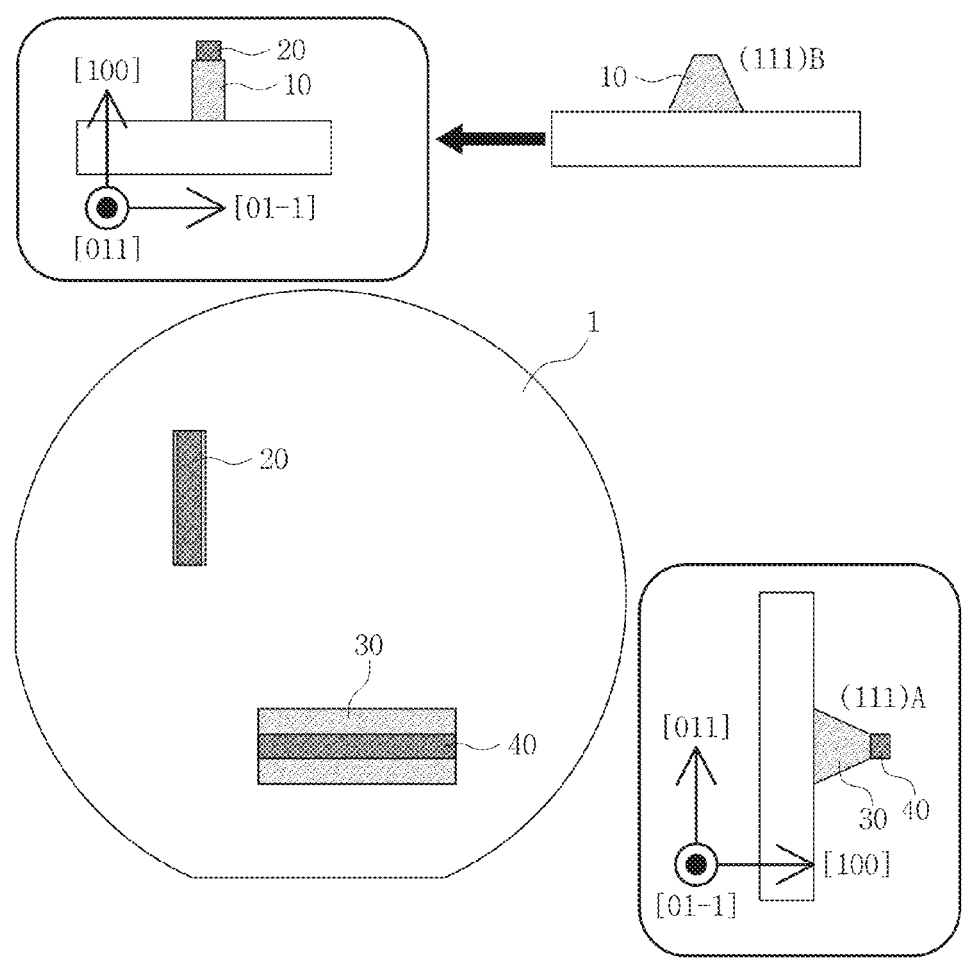
FIG. 1 is a diagram for illustrating the difference in etch rates depending on etching planes of an III-V compound.

FIG. 1 is a diagram for illustrating the difference in etch rates depending on etching planes of an III-V compound.

FIG. 1 shows a surface of a gallium arsenide (GaAs) substrate 1 having a (100) facet. As shown in FIG. 1, it is assumed that sacrificial layers 10, 30 made of gallium arsenide (GaAs) are grown in different directions on the surface of the substrate 1 by epitaxy, and photoresists 20, 40 are formed on the sacrificial layers 10, 30 and used as masks when the sacrificial layers 10, 30 are etched, so that the sacrificial layers 10, 30 are patterned in a shape extending in one direction.

At this time, the etching is performed to the (111) facet of the sacrificial layers 10, 30. Here, since the photoresist 20 is disposed on the sacrificial layer 10 so that the sacrificial layer 10 is etched from a (111)B facet whose facet termination is made of an element in the V group and thus has a relatively faster etch rate, the facet of the sacrificial layer 10 which is not covered by the photoresist 20 is removed fast, and the sacrificial layer 10 may be patterned into the same shape as the photoresist 20. Meanwhile, the photoresist 40 is disposed on the sacrificial layer 30 so that the sacrificial layer 40 is etched from a (111)A facet whose facet termination is made of an element in the III group and thus has a relatively slower etch rate, and thus it takes relatively long time to remove a portion of the sacrificial layer 30 not covered by the photoresist 40.

Figure 2A:
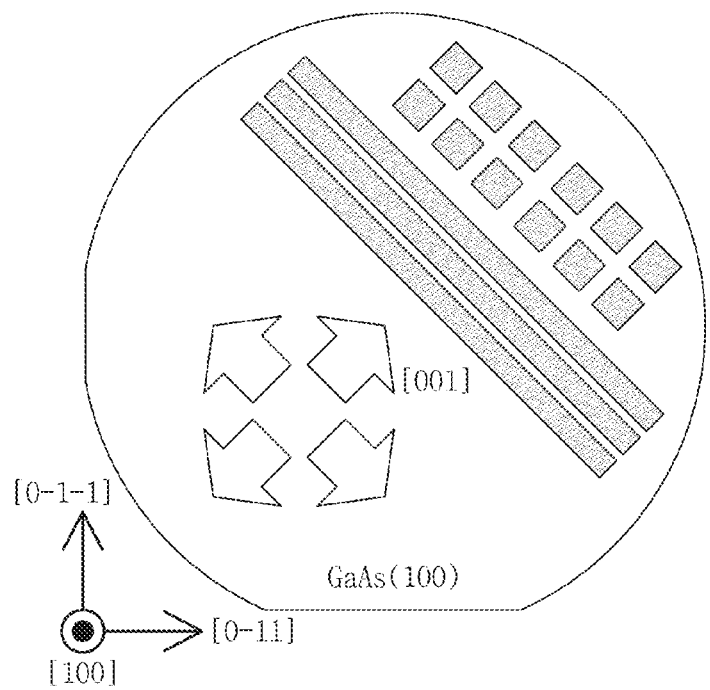
FIGS. 2A to 2C are diagrams for illustrating a direction having a fast etch rate according to a surface orientation of an III-V compound.
Figure 2B:
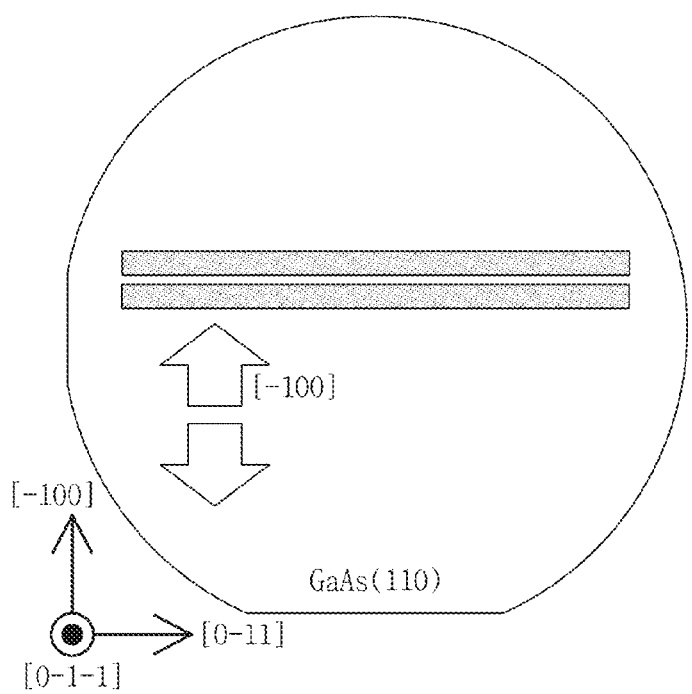
Figure 2C:
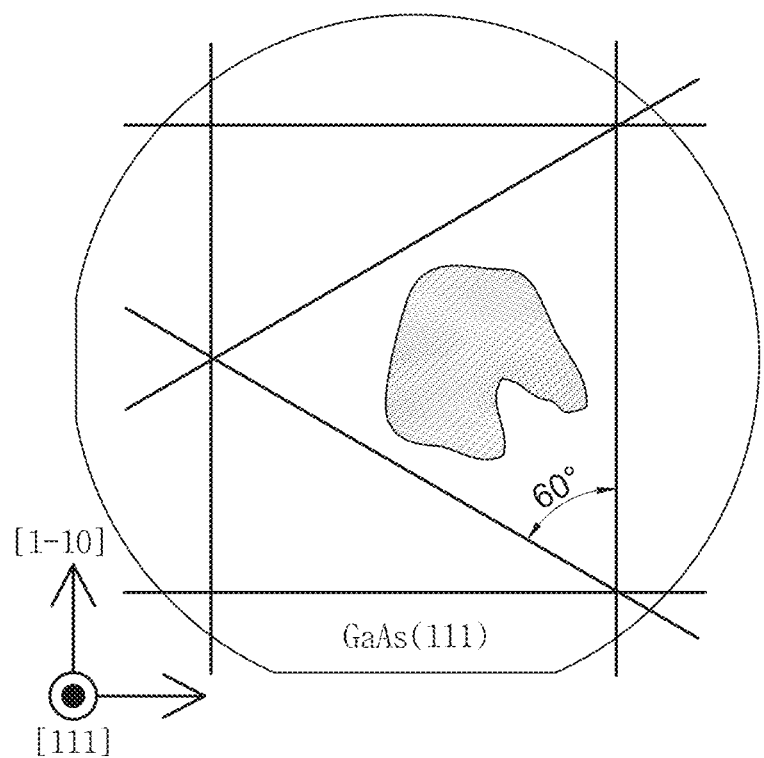

FIGS. 2A to 2C are diagrams for illustrating a direction having a fast etch rate according to a surface orientation of an III-V compound.

FIG. 2A shows a surface of a gallium arsenide (GaAs) substrate having a (100) facet. As shown in FIG. 2A, the (100) facet of the gallium arsenide (GaAs) substrate exhibits a relatively faster etch rate when being etched in a <001> lattice direction, in comparison to other directions. Therefore, if a device is patterned into a shape extending in a direction orthogonal to the <001> lattice direction as shown in FIG. 2A, the device is mostly etched from the direction (i.e., the direction having a fast etch rate) orthogonal to the extending direction, and thus the etch rate may be increased.

As used herein, patterning a device into a shape extending in a direction orthogonal to a specific lattice direction does not means that the entire device has a linear pattern extending in the corresponding direction but just means that primary or most extending direction of the patterned shape is orthogonal to the lattice direction when the pattern is observed as a whole. If the device is patterned to have a shape extending orthogonal to a direction having a fast etch rate, the device is etched from a side of the shape to be patterned, and thus the device is etched mainly from the direction having a fast etch rate, which may increase a process speed.

FIG. 2B shows a surface of a gallium arsenide (GaAs) substrate having a (110) facet. As shown in FIG. 2B, the (110) facet of the gallium arsenide (GaAs) substrate exhibits a relatively faster etch rate when being etched in a <−100> lattice direction, for example in a [−100] or [00-1] direction. Therefore, if a device is patterned into a shape extending in a direction orthogonal to the <−100> lattice direction as shown in FIG. 2B, the etch rate may be increased.

Meanwhile, FIG. 2C shows a surface of a gallium arsenide (GaAs) substrate having a (111) facet. The (111) facet of the gallium arsenide (GaAs) has three etching planes respectively located in [1-10], [10-1] and [0-11] directions, and thus its etch rate does not depend on the direction.

If the plane dependency of the etch rate of the gallium arsenide (GaAs) as described above is used, when gallium arsenide (GaAs) having a specific facet is etched as a sacrificial layer, the shape to be patterned may be determined in consideration of a rate having a fast etch rate, which may improve yield and speed of the etching process. Even though it is illustrated in FIGS. 2A to 2C that a direction has a fast etch rate according to a facet of gallium arsenide (GaAs), other III-V compounds also have similar plane dependency of an etch rate, and it is known in the art in which direction a specific facet of each compound has a fast etch rate. Therefore, the technique of determining a patterning direction based on the above principle may be applied not only to gallium arsenide (GaAs) but also other III-V compounds.

Figure 3:
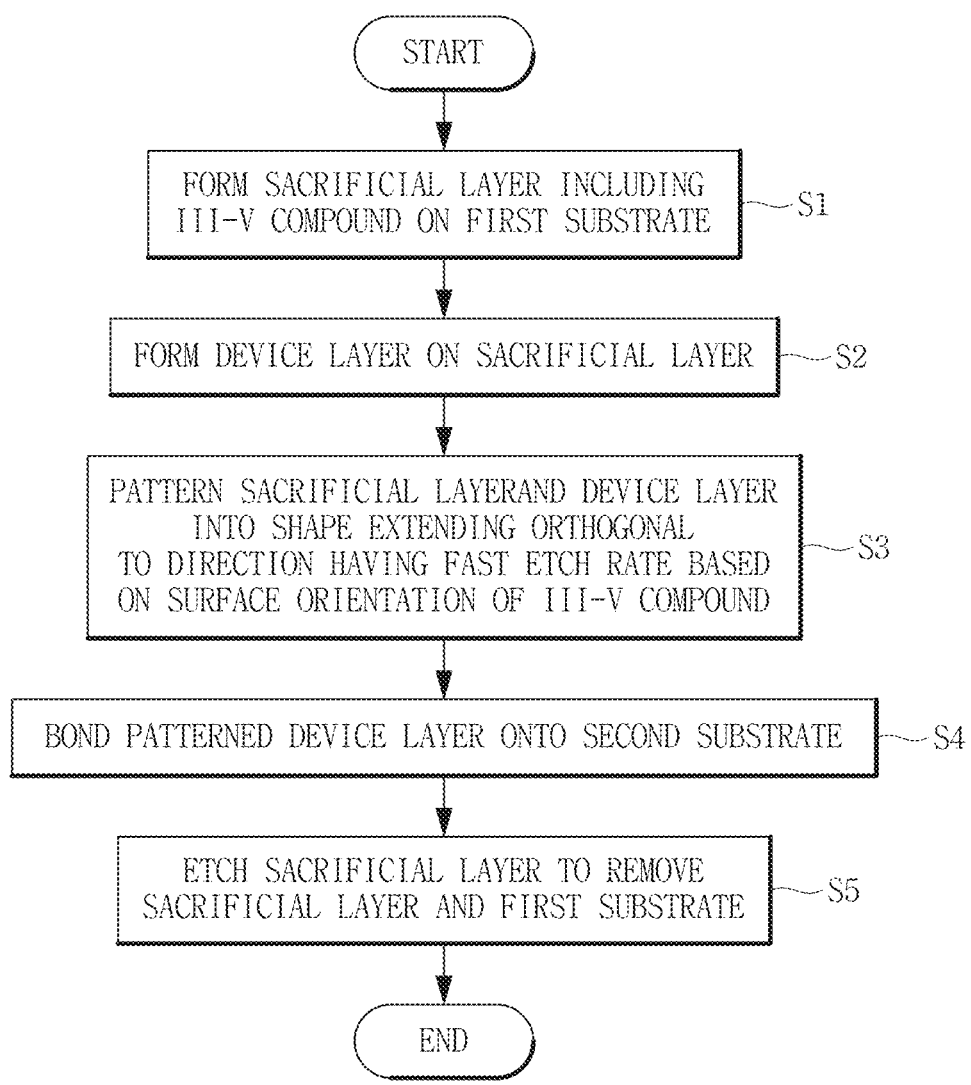
FIG. 3 is a flowchart for illustrating a method for manufacturing a semiconductor device by epitaxial lift-off (ELO) according to an embodiment.

FIG. 3 is a flowchart for illustrating a method for manufacturing a semiconductor device by epitaxial lift-off (ELO) according to an embodiment, and FIGS. 4A to 9B are perspective sectional views and plane views for illustrating each step of the method for manufacturing a semiconductor device according to an embodiment. Hereinafter, each step of the method for manufacturing a semiconductor device according to an embodiment depicted in FIG. 3 will be described with reference to each perspective sectional view and plane view depicted in FIGS. 4A to 9B.

Figure 4A:
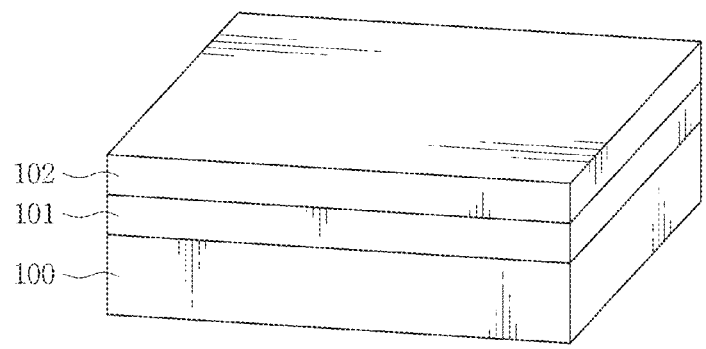
FIGS. 4A to 4C are perspective sectional views and a plane view for illustrating a step of the method for manufacturing a semiconductor device according to an embodiment.
Figure 4B:
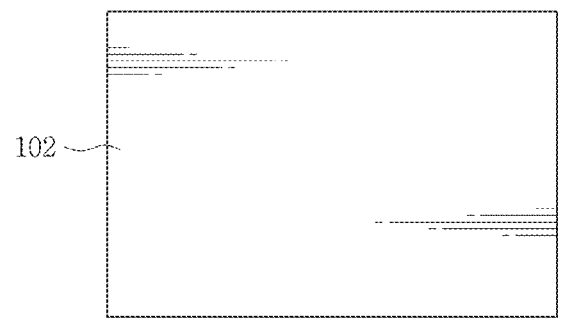

Referring to the perspective sectional view of FIG. 4A and the plane view of FIG. 4B corresponding thereto, a sacrificial layer 101 including an III-V compound may be formed on a first substrate 100 (S1), and a device layer 102 may be formed on the sacrificial layer 101 (S2). The first substrate 100 is made of an III-V compound such as gallium arsenide (GaAs), indium phosphide (InP), gallium nitride (GaN) or the like, and the sacrificial layer 101 may be formed from the first substrate 100 by epitaxial growth. However, this is just an example, and the first substrate 100 may also be made of other materials than the III-V compound.

In an embodiment, before the sacrificial layer 101 is formed on the first substrate 100, an etch-stop layer (not shown) may be further formed. The etch-stop layer may be made of a material not dissolved during a following etching process of the sacrificial layer 101, which will be explained later.

Later, the sacrificial layer 101 is used for separating the first substrate 100 and the sacrificial layer 101 from a silicon (Si) substrate by bonding the device layer 102 to the silicon (Si) substrate and then removing the sacrificial layer 101. For example, the sacrificial layer 101 may be made of an III-V compound including high-concentration aluminum (Al) easily etched by a hydrogen fluoride (HF) solution or a hydrogen chloride (HCl) solution, for example aluminum arsenide (AlAs), without being limited thereto.

The device layer 102 is a layer made of a semiconductor material required for configuring a semiconductor device aimed in this embodiment. In an embodiment, the device layer 102 is made of an III-V compound, similar to the sacrificial layer 101, and may also be formed from the sacrificial layer 101 by epitaxy. However, this is just an example, and the device layer 102 may also be made of other material than the III-V compound. In addition, the device layer 102 may also be at least partially n-type or p-type doped.

Figure 4C:
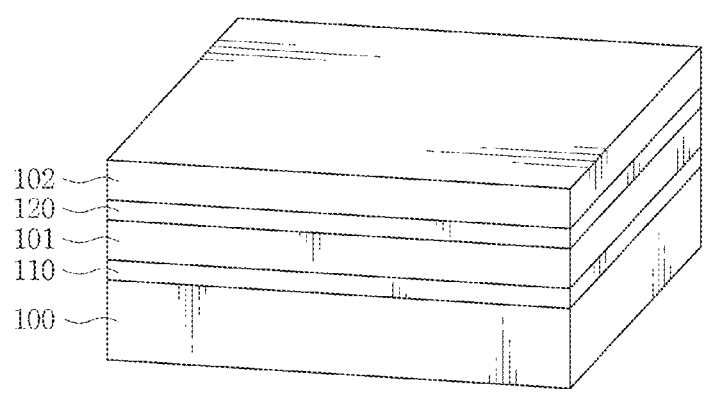

In an embodiment, as shown in FIG. 4C, hydrophilic layers 110, 120 are formed to be located in at least one of upper and lower portions of the sacrificial layer 101. In other words, the hydrophilic layer 110 is formed on the first substrate 100, and the sacrificial layer 101 is formed thereon, or the hydrophilic layer 120 may be formed on the sacrificial layer 101. Even though FIG. 4C illustrates an embodiment where the hydrophilic layers 110, 120 are located at both upper and lower portions of the sacrificial layer 101, time and costs required for forming the hydrophilic layer may be reduced by forming any one of the hydrophilic layers 110, 120.

The hydrophilic layers 110, 120 may play a role of speeding up the ELO process by more easily adsorbing the etching solution to the sacrificial layer 101, when the sacrificial layer 101 is removed using the etching solution. For this, the hydrophilic layers 110, 120 are made of a material having a great mutual attraction with the etching solution (for example, a solution in which hydrogen fluoride (HF) and deionized water (DIW) are mixed at a predetermined ratio, or a solution further including isopropyl alcohol (IPA) and/or acetone), which will be explained later. For example, if the first substrate 100 is made of gallium arsenide (GaAs), the hydrophilic layers 110, 120 may include indium gallium phosphide (InGaP) or indium phosphide (InP), without being limited thereto, and may also be made of a material having a stronger hydrophilic property in comparison to the first substrate 100.

Figure 5A:
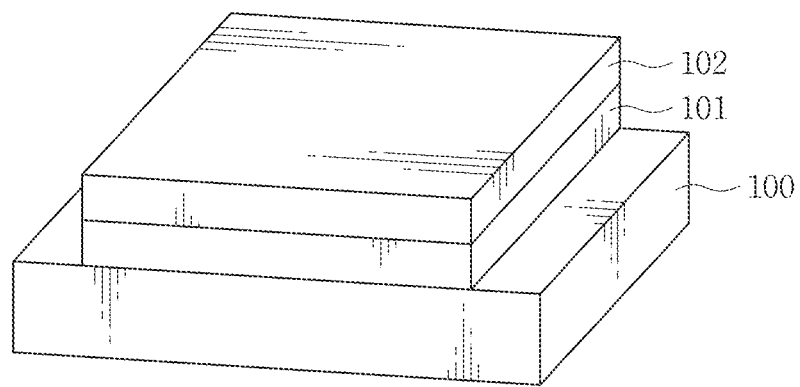
FIGS. 5A and 5B are a perspective sectional view and a plane view for illustrating another step of the method for manufacturing a semiconductor device according to an embodiment.
Figure 5B:
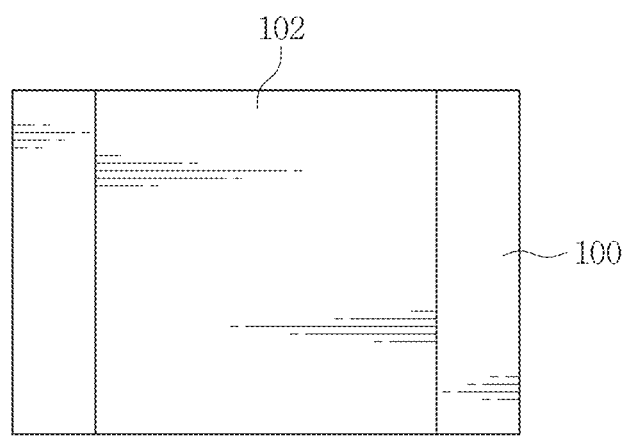

Referring the perspective sectional view of FIG. 5A and the plane view of FIG. 5B corresponding thereto, the sacrificial layer 101 and the device layer 102 may be patterned according to a shape of a semiconductor device to be manufactured (S3). Meanwhile, if the hydrophilic layer is located at the upper and/or lower portion of the sacrificial layer 101, the hydrophilic layer may also be patterned similar to the sacrificial layer 101.

At this time, as described above with reference to FIGS. 2A to 2C, a direction in which the sacrificial layer 101 and the device layer 102 are patterned to extend is determined according to the surface orientation of the III-V compound of the sacrificial layer 101. In other words, in order to etch the sacrificial layer 101 from a direction where the III-V compound of the sacrificial layer 101 exhibits a fast etch rate, the sacrificial layer 101 and the device layer 102 are patterned into a shape extending orthogonal to the direction having a fast etch rate.

The patterning process may be accompanied by locating a mask corresponding to a shape of a device to be manufactured on the sacrificial layer 101 and the device layer 102 after rotating the mask to extend orthogonal to the direction where the compound exhibits a fast etch rate, partially exposing and removing photoresist coated in advance on the device layer 102 by using the mask, and then etching regions of the sacrificial layer 101 and the device layer 102 which are exposed to the etching solution to remove the photoresist. The etching may be performed by wet etching using an etching solution based on phosphoric acid ($H_3PO_4$), without being limited thereto. After the etching, the photoresist and the mask are removed.

Since the etching is performed from a direction having a fast etch rate due to the patterned shape of the sacrificial layer 101, the sacrificial layer 101 may be etched in a great process speed. In addition, after the sacrificial layer 101 is etched, the device may be rotated by a predetermined angle as necessary for a following process such as bonding to another device.

Figure 6A:
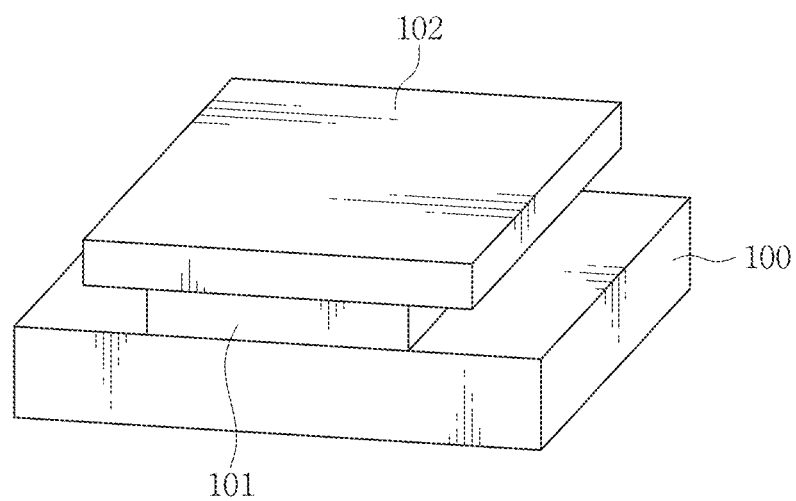
FIGS. 6A and 6B are a perspective sectional view and a plane view for illustrating further another step of the method for manufacturing a semiconductor device according to an embodiment.
Figure 6B:
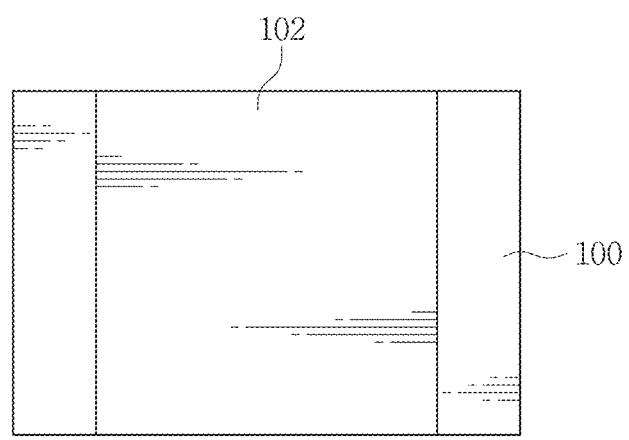
Figure 7A:
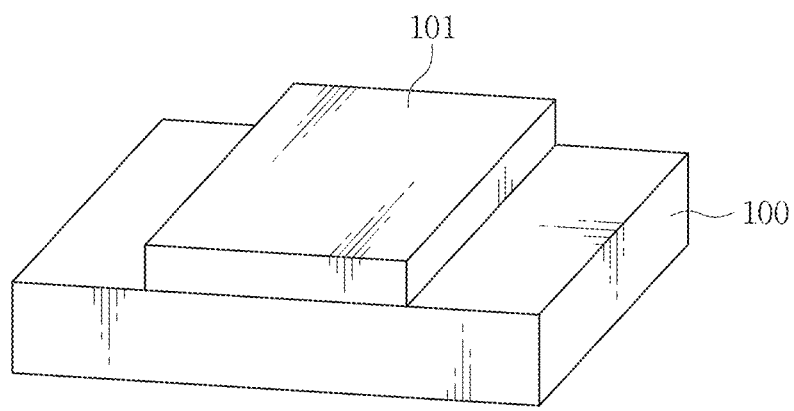
FIGS. 7A and 7B are a perspective sectional view and a plane view for illustrating further another step of the method for manufacturing a semiconductor device according to an embodiment.
Figure 7B:
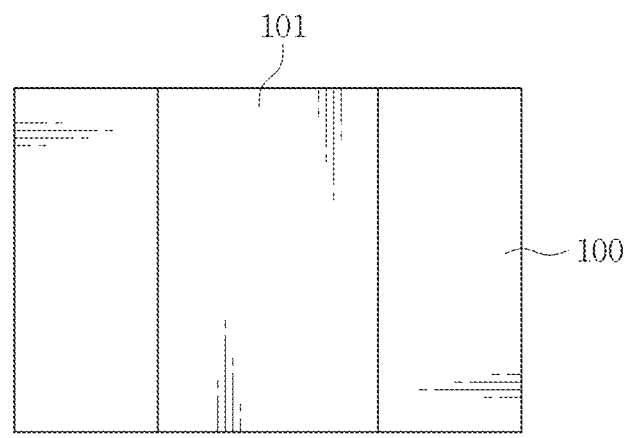

FIGS. 6A and 6B are a perspective sectional view and a plane view showing that the sacrificial layer 101 is partially removed after the device layer 102 is patterned, for the comparison with the conventional ELO process, and FIGS. 7A and 7B are a perspective sectional view and a plane view showing that the device layer 102 is removed, for observing the structure depicted in FIGS. 6A and 6B.

The sacrificial layer 101 may be etched using an etching solution including hydrogen fluoride (HF) and deionized water. For example, a structure may be dipped for 10 seconds in an etching solution in which hydrogen fluoride (HF) and deionized water are mixed at a volume ratio of 1:3, so that the sacrificial layer 101 is etched. In addition, the device layer 102 may be etched using a citric acid as the etching solution, and for example, the device layer 102 may be removed by dipping the structure in the citric acid solution for 5 seconds. However, the above etching solution and process are just examples, and reactants and reaction conditions for etching may be differently set depending on material, thickness or the like of the sacrificial layer 101 and/or the device layer 102.

Figure 10:
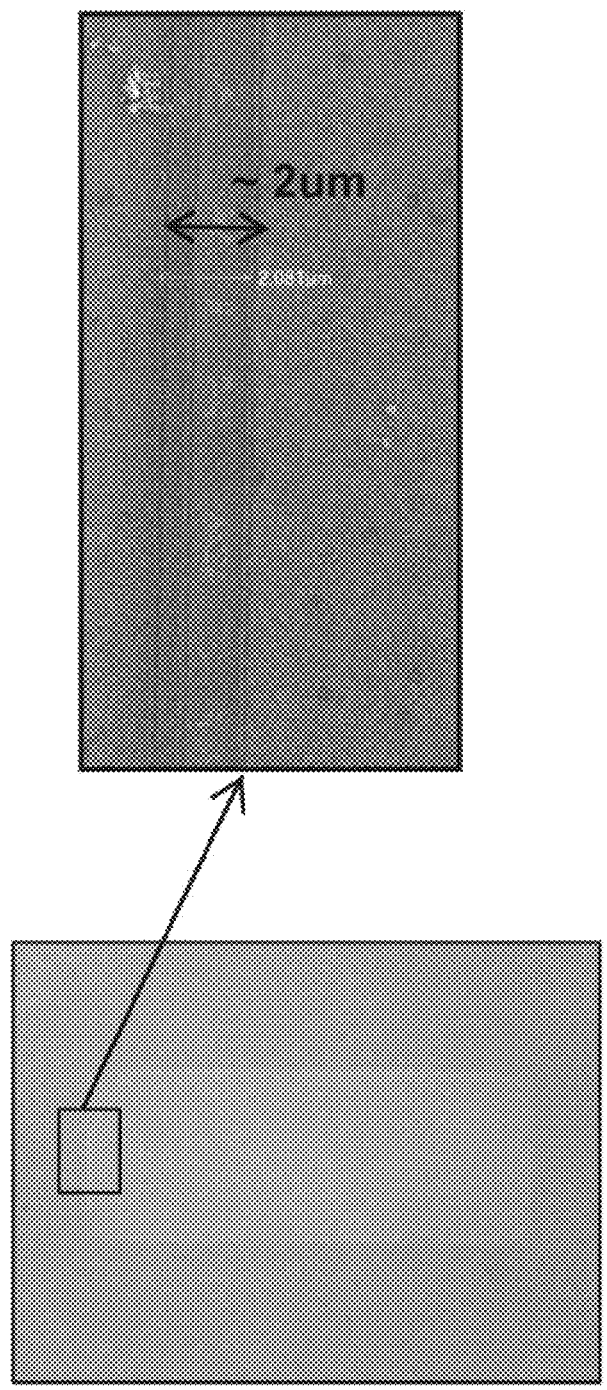
FIG. 10 is an image showing an etching plane of a sacrificial layer in a conventional ELO process.
Figure 11:
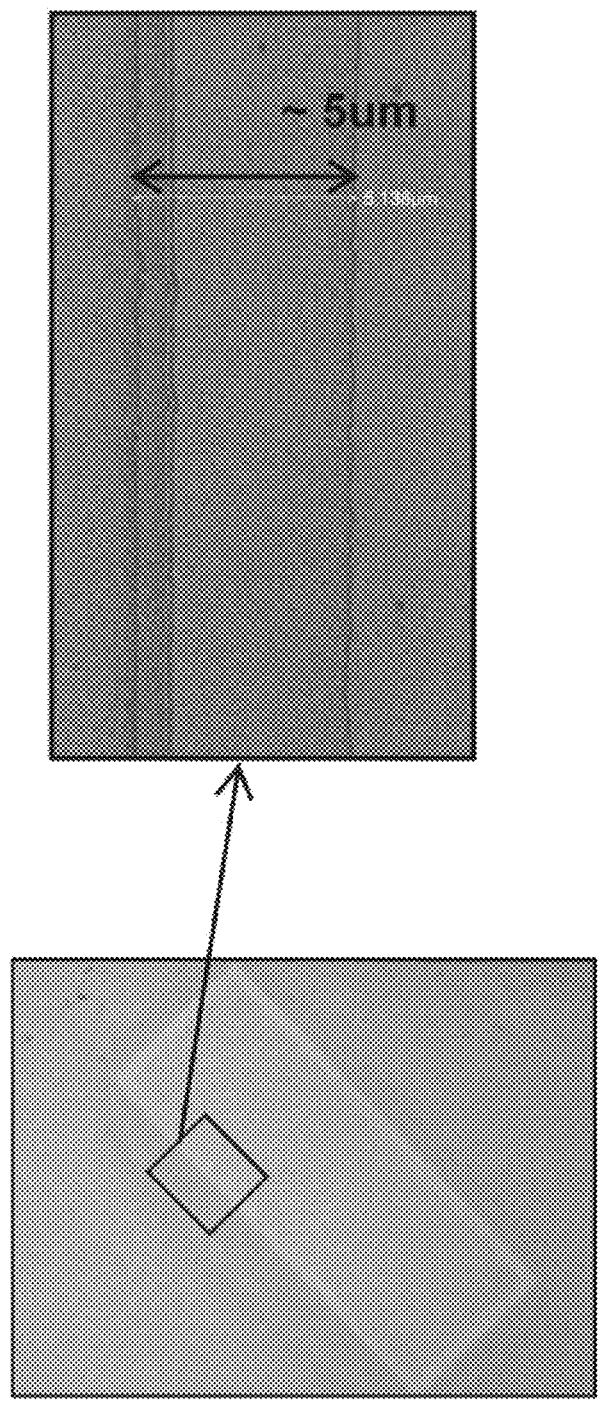
FIG. 11 is an image showing an etching plane of the sacrificial layer in an ELO process according to an embodiment of the present disclosure.

FIG. 10 is an image showing an etching plane of a sacrificial layer after the structure depicted in FIGS. 7A and 7B is obtained using the conventional ELO process, and FIG. 11 is an image showing an etching plane of a sacrificial layer after the structure depicted in FIGS. 7A and 7B is obtained by the method for manufacturing a semiconductor device by ELO according to an embodiment of the present disclosure.

As shown in FIG. 10, in the conventional ELO process, a patterning direction is not particularly adjusted according to a surface orientation of a sacrificial layer, and as a result of etching, the sacrificial layer is etched inwards at its edge as much as about 2 μm.

Meanwhile, as shown in FIG. 11, in the method for manufacturing a semiconductor device according to this embodiment, the sacrificial layer is patterned to have a shape orthogonal to a 45° direction in which the sacrificial layer is etched fast, and as a result, it has been found that the edge of the sacrificial layer is more etched as much as about 5 μm when the etching performed with the same conditions and time as in FIG. 10. In other words, the sacrificial layer is etched more during the same time, which exhibits that the etching yield and speed increase.

Figure 8A:
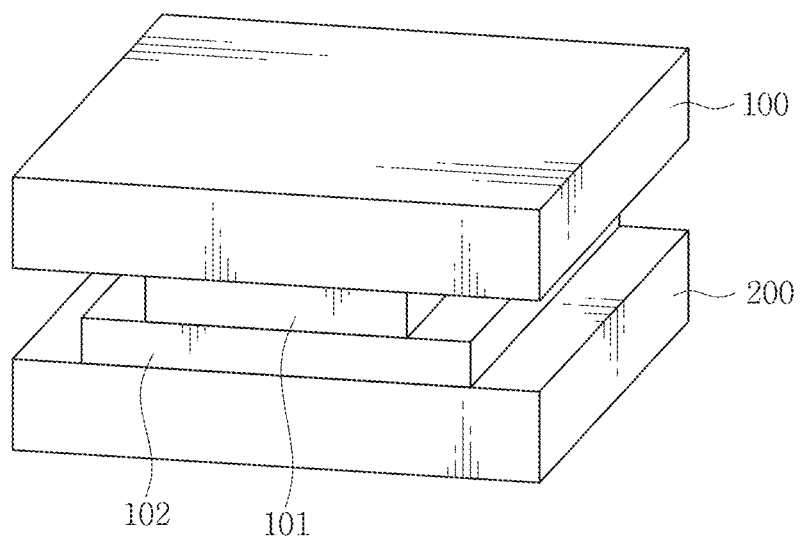
FIGS. 8A and 8B are a perspective sectional view and a plane view for illustrating further another step of the method for manufacturing a semiconductor device according to an embodiment.
Figure 8B:
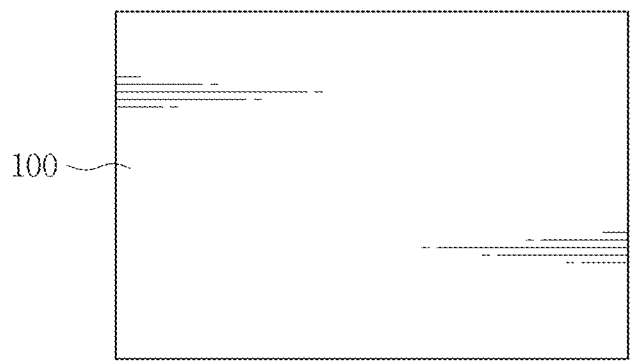

Referring to FIG. 3 again, after the sacrificial layer 101 and the device layer 102 are patterned in consideration of the surface orientation of the III-V compound of the sacrificial layer 101, the patterned device layer 102 may be bonded to a surface of a second substrate 200 as shown in the perspective sectional view of FIG. 8A and the plane view of FIG. 8B corresponding thereto (S4). The second substrate 200 made of silicon (Si).

In an embodiment, before the bonding, a process of removing natural oxide films formed on the device layer 102 and the second substrate 200 is further performed. Also, in an embodiment, before the bonding, the device layer 102 and/or the second substrate 200 is treated with plasma to be activated.

Figure 9A:
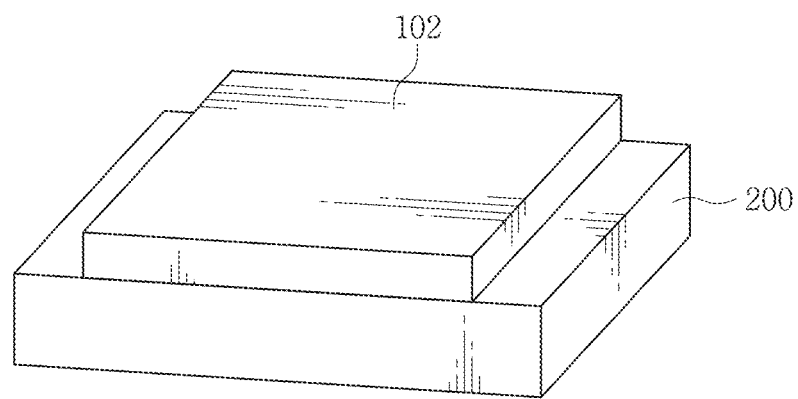
FIGS. 9A and 9B are a perspective sectional view and a plane view for illustrating further another step of the method for manufacturing a semiconductor device according to an embodiment.
Figure 9B:
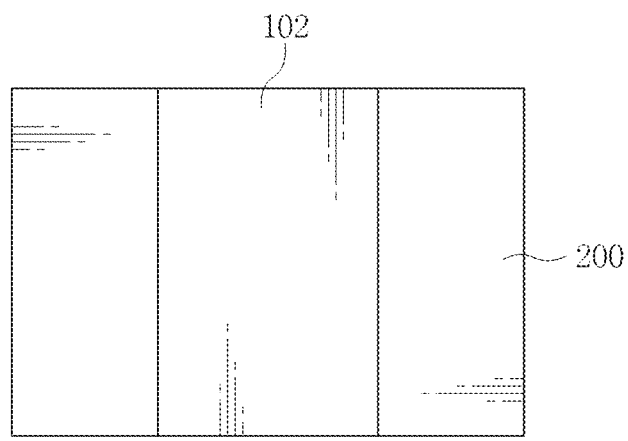

Next, if the sacrificial layer 101 is etched in a state where the device layer 102 is bonded to the second substrate 200 and thus the sacrificial layer 101 is entirely removed by etching, the first substrate 100 is removed from the second substrate 200, and thus the device as shown in the perspective sectional view of FIG. 9A and the plane view of FIG. 9B is obtained (S5). According to the method for manufacturing a semiconductor device according to the above embodiments, since the device and the sacrificial layer are patterned by etching from a direction having a fast etch rate in consideration of the difference in etch rates depending on crystal orientation which is an inherent characteristic of the III-V compound, the process yield may be improved in comparison to the conventional ELO process, and also the process speed may be increased.

In an embodiment, if the hydrophilic layer is located at the upper and/or lower portion of the sacrificial layer 101, while the sacrificial layer 101 is being removed by etching, the hydrophilic layer adsorbs the etching solution to the sacrificial layer 101 more easily, thereby speeding up the ELO process.

Figure 12:
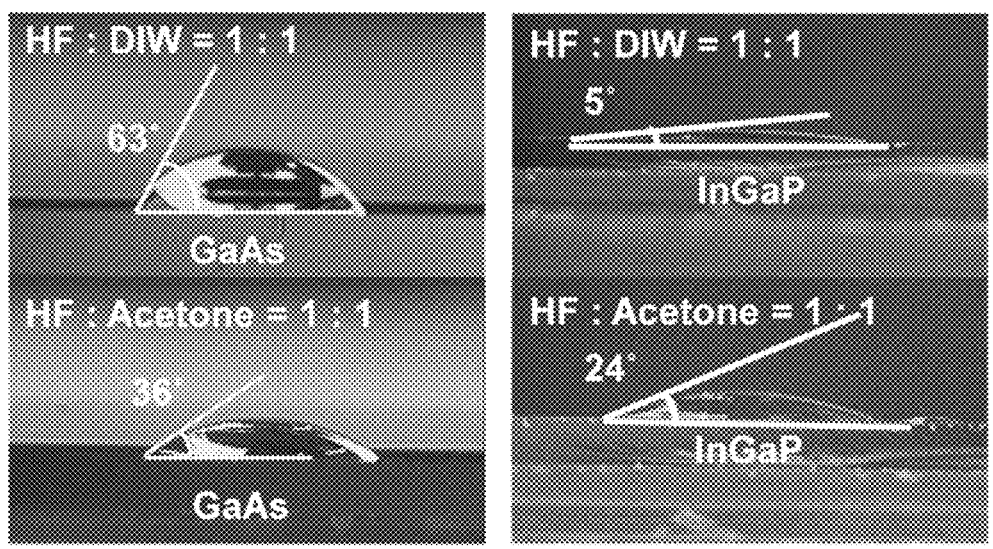
FIG. 12 is a diagram showing the degree of adsorption of different etching solutions into surfaces of different materials.

FIG. 12 is a diagram showing the degree of adsorption of different etching solutions into surfaces of different materials. Referring to FIG. 12, a left portion shows the degree of adsorption of an etching solution (for example, a solution where HF and deionized water are mixed at a ratio of 1:1, or a solution where HF and acetone are mixed at a ratio of 1:1) to the first substrate made of gallium arsenide (GaAs), when the hydrophilic layer is not formed as the conventional technique. Meanwhile, a right portion shows the degree of adsorption of the etching solution to a hydrophilic layer when the hydrophilic layer made of indium gallium phosphide (InGaP) is formed according to an embodiment of the present disclosure. Since the intermolecular attraction between components of the etching solution and the hydrophilic layer (the InGaP layer) is stronger than the intermolecular attraction between components of the etching solution and the hydrophobic layer (the GaAs layer), the etching solution is adsorbed to the surface of the hydrophilic layer more strongly, and thus as shown in the figures, the angle of water drop between the surface of the hydrophilic layer and the etching solution is smaller.

Referring a left portion of FIG. 12 (where there is no additional hydrophilic layer), the adsorption to the structure is stronger when the etching solution is made of a mixed solution of hydrogen fluoride (HF) and acetone ($CH_3COCH_3$), compared with the case where the etching solution is made of a mixed solution of hydrogen fluoride (HF) and deionized water (DIW). Generally, the etch rate is faster when the etching solution has a high pH (namely, basicity) in comparison to the case where the etching solution has a low pH (namely, acidity). If the etching solution has a high pH (namely, basicity), the hydrophilic property decreases, and the etch rate becomes slower as much. Thus, high pH and the degree of hydrophilic property has a trade-off relation with regard to the etch rate.

However, referring to a right portion of FIG. 12, if the hydrophilic layer is formed on the first substrate according to some embodiments, even though a mixed solution of hydrogen fluoride (HF) and deionized water (DIW) is used as the etching solution to have a higher pH, the adsorption to the structure is stronger in comparison to the case where a mixed solution of hydrogen fluoride (HF) and acetone ($CH_3COCH_3$) is used as the etching solution. Therefore, when the hydrophilic layer is formed in at least a part of the upper and lower portions of the sacrificial layer according to the above embodiments, an etching solution having a lower pH (for example, a mixed solution of hydrogen fluoride (HF) and deionized water) may be used, and thus, resultantly, the sacrificial layer may be etched faster in comparison to the conventional technique, thereby speeding up the ELO process.

Figure 13:
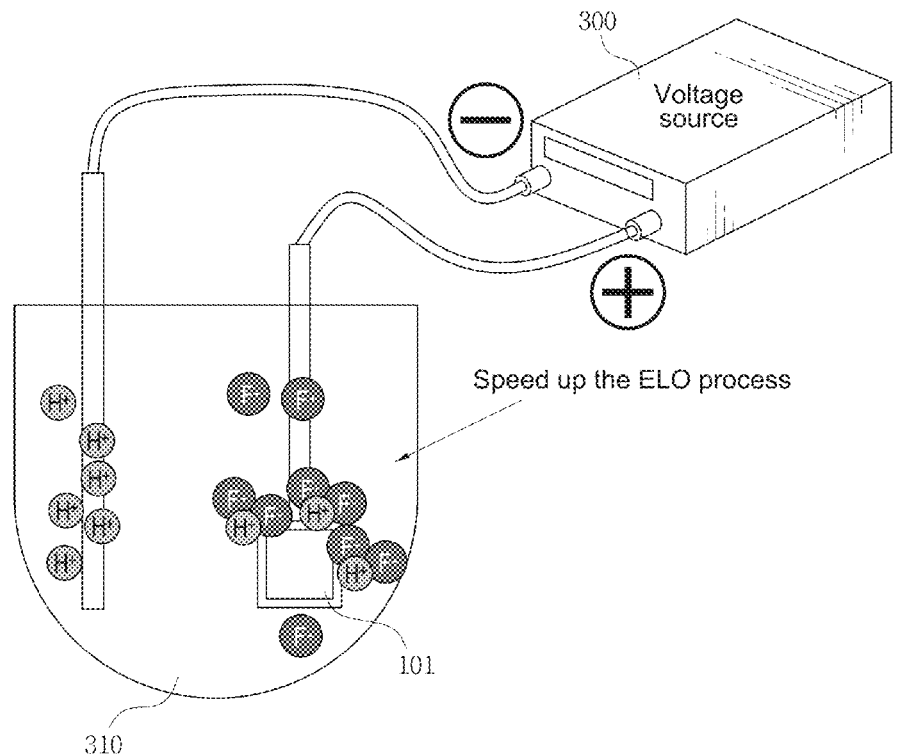
FIG. 13 is a diagram showing an etching machine for speeding up the ELO process by applying a voltage to the sacrificial layer according to an embodiment.

In an embodiment, the step of removing the sacrificial layer 101 by etching includes applying a voltage so that the sacrificial layer 101 exhibits positive polarity. FIG. 13 is a diagram showing an etching machine for speeding up the ELO process by applying a voltage to the sacrificial layer according to an embodiment. Referring to FIG. 13, the step of applying a voltage so that the sacrificial layer 101 exhibits positive polarity may include making an anode of a voltage source 300 into contact with the sacrificial layer 101, and exposing a cathode of the voltage source 300 to the etching solution.

In an embodiment, the above step is performed using a bath 310 containing the etching solution, so that the sacrificial layer 101 is dipped in the etching solution and thus exposed to the etching solution. The bath 310 may be made of glass, without being limited thereto.

Hereinafter, a process of removing the sacrificial layer 101 in case a voltage is applied to the sacrificial layer 101 by the voltage source 300 will be described in detail, based on an example where the sacrificial layer 101 includes aluminum arsenide (AlAs) and the etching solution includes hydrogen fluoride (HF) as an embodiment.

In the solution including hydrogen fluoride (HF), [H+] ions, [F−] ions, [$HF_2$−] ions and [$H_2F_3$−] ions may be present. Here, in a state where a voltage is not applied, in the solution, [H+] ions and [F−] ions are present at a higher ratio in comparison to [$HF_2$−] ions or [$H_2F_3$−] ions. However, if a certain voltage is applied to the solution, [$HF_2$−] ions and [$H_2F_3$−] ions may be generated more due to the movement of electrons and the change of bonding structures.

Figure 14:
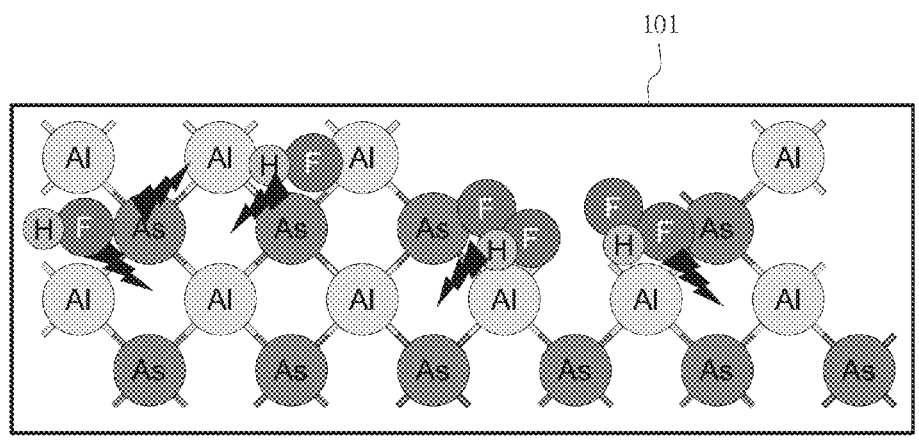
FIG. 14 is a diagram showing that ions of the etching solution, generated by applying a voltage to the sacrificial layer according to an embodiment, decompose the coupled structure of the sacrificial layer.

Therefore, if a voltage is applied to an etching solution including hydrogen fluoride (HF), the generated [$HF_2$−] ions and [$H_2F_3$−] ions decompose the bonding structure of aluminum arsenide (AlAs) in the sacrificial layer 101 as shown in FIG. 14, thereby removing the sacrificial layer 101.

Figure 15A:
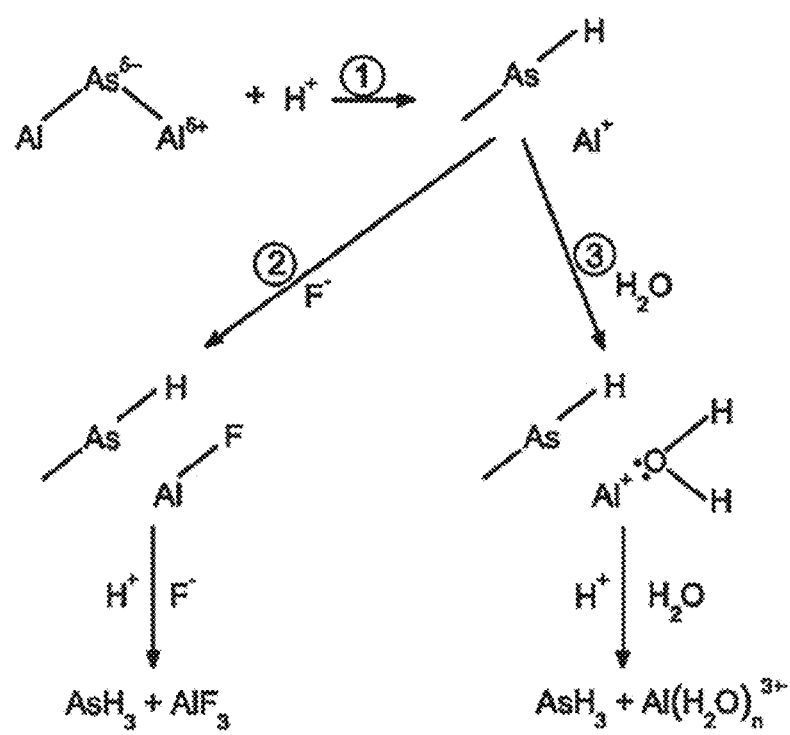
FIG. 15A is a diagram showing a process where molecular bonds of the sacrificial layer are decomposed when the sacrificial layer is etched without applying a voltage thereto.
Figure 15B:
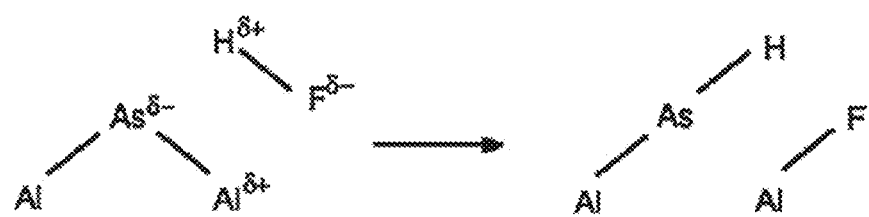
FIG. 15B is a diagram showing a process where molecular bonds of the sacrificial layer are decomposed when the sacrificial layer is etched while applying a voltage thereto.

FIG. 15A is a diagram showing a process where molecular bonds of the sacrificial layer are decomposed when the sacrificial layer is etched without applying a voltage thereto, and FIG. 15B is a diagram showing a process where molecular bonds of the sacrificial layer are decomposed when the sacrificial layer is etched while applying a voltage thereto.

Referring to FIGS. 15A and 15B, while the bonding structure of AlAs is being decomposed, it can be understood that [H+] ions and [F−] ions where hydrogen bonds of hydrogen (H) and fluorine (F) are dissociated are decomposed in a different way from [$HF_2$−] ions and [$H_2F_3$−] ions where the hydrogen bonds are not dissociated. Referring to FIG. 15A showing a process where [H+] ions and [F−] ions having dissociated hydrogen bonds decompose the bonding structure of AlAs, the Al—As bond is separated first by hydrogen ion, and $AsH_3$ and $AlF_3$ are generated by the combination with fluorine ion, which thus needs two step. However, referring to FIG. 15B showing a process where [$HF_2$−] ions and [$H_2F_3$−] ions having non-dissociated hydrogen bonds decompose the bonding structure of AlAs, it can be found that the bond of Al—As is decomposed just through a single step by interaction between dipolar polarization of the H—F bond and dipolar polarization of the Al—As bond.

Therefore, as ions having non-dissociated H—F hydrogen bonds such as [$HF_2$−] ions or [$H_2F_3$−] ions are present more in the hydrogen fluoride (HF) solution, the bonding structure of AlAs may be decomposed faster. In other words, as the concentration of [$HF_2$−] ions or [$H_2F_3$−] ions becomes higher by applying a voltage to the etching solution including hydrogen fluoride (HF), the sacrificial layer 101 including aluminum arsenide (AlAs) is removed faster.

Referring to FIG. 13, in an embodiment, if the anode of the voltage source comes into contact with the sacrificial layer 101, AlAs in the sacrificial layer 101 may be exposed more to ions having negative polarity such as [$HF_2$−] ions or [$H_2F_3$−] ions. As a result, AlAs in the sacrificial layer is decomposed faster, and thus the sacrificial layer is removed faster, thereby shortening the time required for the ELO process.

Figure 16:
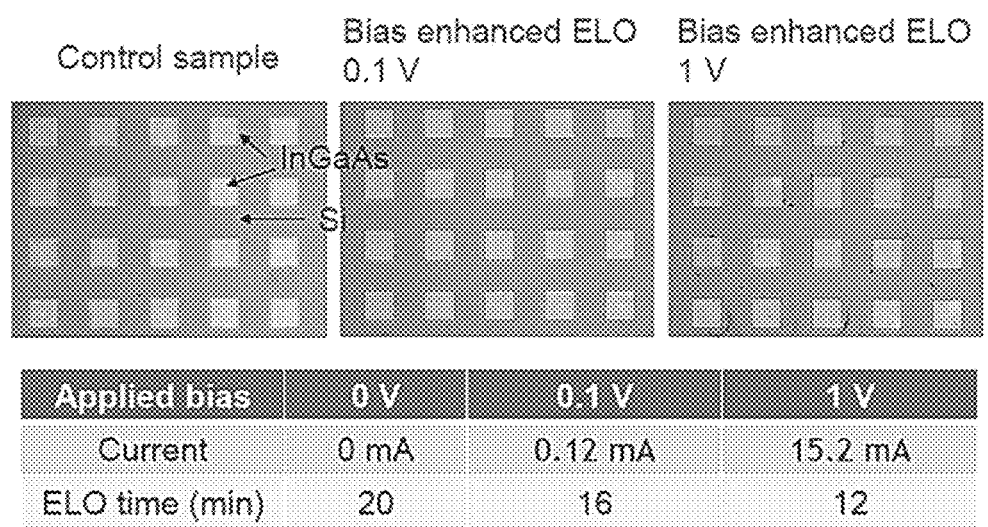
FIG. 16 is a table showing that an ELO process time decreases depending on the voltage applied to the sacrificial layer according to an embodiment and a perspective sectional view showing the semiconductor device after the process.

FIG. 16 is a table showing that an ELO process time decreases depending on the voltage applied to the sacrificial layer according to an embodiment and a perspective sectional view showing the semiconductor device after the process.

Referring to FIG. 16, it can be found that the time required for the ELO process is 20 minutes when a voltage is not applied to the sacrificial layer and the etching solution, but the time required for the ELO process is reduced to 16 minutes when a voltage of 0.1V is applied, and the time required for the ELO process is reduced to 12 minutes when a voltage of 1V is applied. Even though experiments have been performed using voltages of 0.1V and 1V in this specification, detailed voltage values are not limited thereto, and an optimal value could be found through experiments. In addition, from the section of the semiconductor device after the ELO process, depicted at the upper portion of FIG. 16, it can be understood that patterns are successfully transferred regardless of the application of voltage.

The description hereinabove has been described with reference to the embodiments depicted in the drawings, but they are just for illustrative purposes only, and it should be understood that various modifications and changes can be made therefrom by those skilled in the art. However, these modifications should be regarded as being within the scope of the present disclosure. Therefore, the scope of protection of the present disclosure should be defined by the appended claims.

What is claimed is:

1. A method for manufacturing a semiconductor device by epitaxial lift-off, comprising:
    forming a sacrificial layer containing an III-V compound on a first substrate;
    forming a device layer on the sacrificial layer;
    patterning the sacrificial layer and the device layer into a shape having an extending portion along a first direction determined based on a surface orientation of the III-V compound of the sacrificial layer;
    bonding the patterned device layer onto a second substrate; and
    etching the sacrificial layer by using an etching solution in a state where the device layer is bonded onto the second substrate, to remove the sacrificial layer and the first substrate.

2. The method for manufacturing a semiconductor device by epitaxial lift-off according to claim 1,
    wherein the III-V compound has different etch rates depending on surface orientations, and
    wherein the first direction is orthogonal to a lattice direction in which the III-V compound of the sacrificial layer has a fastest etch rate.

3. The method for manufacturing a semiconductor device by epitaxial lift-off according to claim 1, wherein the etching of the sacrificial layer comprises etching a side of the sacrificial layer from a second direction which is orthogonal to the first direction.

4. The method for manufacturing a semiconductor device by epitaxial lift-off according to claim 1,
    wherein the III-V compound of the sacrificial layer has a (100) facet, and
    wherein the first direction is a <001> lattice direction.

5. The method for manufacturing a semiconductor device by epitaxial lift-off according to claim 1,
    wherein the III-V compound of the sacrificial layer has a (110) facet, and
    wherein the first direction is a <−100> lattice direction.

6. The method for manufacturing a semiconductor device by epitaxial lift-off according to claim 1, wherein the etching solution comprises hydrogen fluoride (HF) and deionized water.

7. The method for manufacturing a semiconductor device by epitaxial lift-off according to claim 6, wherein in the etching solution, a volume ratio of hydrogen fluoride (HF) and deionized water is 1:3.

8. The method for manufacturing a semiconductor device by epitaxial lift-off according to claim 1, before forming the sacrificial layer, further comprising forming an etch-stop layer on the first substrate.

9. The method for manufacturing a semiconductor device by epitaxial lift-off according to claim 1,
    wherein the first substrate comprises an III-V compound, and
    wherein the sacrificial layer is formed on the first substrate by epitaxy growth.

10. The method for manufacturing a semiconductor device by epitaxial lift-off according to claim 1, wherein the second substrate comprises silicon (Si).

11. The method for manufacturing a semiconductor device by epitaxial lift-off according to claim 1, further comprising forming a hydrophilic layer located in at least one of upper and lower portions of the sacrificial layer.

12. The method for manufacturing a semiconductor device by epitaxial lift-off according to claim 11,
    wherein the hydrophilic layer comprises indium gallium phosphide (InGaP) or indium phosphide (InP).

13. The method for manufacturing a semiconductor device by epitaxial lift-off according to claim 1, wherein the etching solution comprises hydrogen fluoride (HF) and acetone ($CH_3COCH_3$).

14. The method for manufacturing a semiconductor device by epitaxial lift-off according to claim 1, wherein the etching of the sacrificial layer comprises applying a voltage to the sacrificial layer to have positive polarity.

15. The method for manufacturing a semiconductor device by epitaxial lift-off according to claim 14, wherein the applying of a voltage to the sacrificial layer to have positive polarity comprises:
    making an anode of a voltage source into contact with the sacrificial layer; and
    exposing a cathode of the voltage source to the etching solution.

16. The method for manufacturing a semiconductor device by epitaxial lift-off according to claim 15,
    wherein the sacrificial layer comprises aluminum arsenide (AlAs), and
    wherein the etching solution comprises hydrogen fluoride (HF).

17. The method for manufacturing a semiconductor device by epitaxial lift-off according to claim 16, wherein the etching of the sacrificial layer comprises:
    applying a voltage to generate $[HF_2-]$ or $[H_2F_3-]$ ions in the etching solution; and
    reacting the $[HF_2-]$ or $[H_2F_3-]$ ions with the sacrificial layer to etch the sacrificial layer.

* * * * *